US012584953B2

(12) United States Patent
Thei et al.

(10) Patent No.: US 12,584,953 B2
(45) Date of Patent: Mar. 24, 2026

(54) SEMICONDUCTOR TESTING DEVICE AND METHOD OF OPERATING THE SAME

(71) Applicant: Taiwan Semiconductor Manufacturing Company, Ltd., Hsinchu (TW)

(72) Inventors: Kong-Beng Thei, Hsinchu (TW);
Jung-Hui Kao, Hsinchu (TW);
Jing-Jung Huang, Hsinchu (TW);
Fu-Hsiung Yang, Zhongli City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 18/758,635

(22) Filed: Jun. 28, 2024

(65) Prior Publication Data

US 2024/0353474 A1      Oct. 24, 2024

Related U.S. Application Data

(63) Continuation of application No. 17/664,771, filed on May 24, 2022, now Pat. No. 12,050,245.

(60) Provisional application No. 63/305,726, filed on Feb. 2, 2022.

(51) Int. Cl.
G01R 31/28 (2006.01)

(52) U.S. Cl.
CPC ..... G01R 31/2831 (2013.01); G01R 31/2884 (2013.01)

(58) Field of Classification Search
CPC . G01R 31/28; G01R 31/2856; G01R 31/2884
See application file for complete search history.

(56) References Cited

U.S. PATENT DOCUMENTS

| | | | |
|---|---|---|---|
| 5,321,277 A * | 6/1994 | Sparks | G01R 31/3163 |
| | | | 365/201 |
| 6,209,110 B1 | 3/2001 | Chhor et al. | |
| 2013/0026466 A1 | 1/2013 | Pagani | |
| 2014/0151701 A1* | 6/2014 | Fuergut | H01L 21/56 |
| | | | 257/773 |
| 2020/0075435 A1 | 3/2020 | Chen et al. | |
| 2021/0249372 A1* | 8/2021 | Hsu | H01L 24/19 |
| 2022/0189834 A1 | 6/2022 | Lin | |
| 2023/0243885 A1 | 8/2023 | Thei et al. | |

* cited by examiner

*Primary Examiner* — Eman A Alkafawi
*Assistant Examiner* — Courtney C McDonnough
(74) *Attorney, Agent, or Firm* — Harrity & Harrity, LLP

(57) ABSTRACT

A plurality of devices for testing, connected in series using one or more redistribution layers (RDLs), are used to perform a semiconductor device test on a plurality of dies. As a result, the semiconductor device test may support thousands of gross dies per wafer or greater (e.g., 10,000 dies or greater). Furthermore, the RDL(s) may be removed after use. In some implementations, the devices for testing corresponding to the dies may execute the semiconductor device test sequentially. Accordingly, test data may be generated and may include a bit sequence, where a first bit in the bit sequence indicates an overall outcome for the test and one or more subsequent bits in the bit sequence indicate respective outcomes for each semiconductor dies or for each line of the semiconductor device test.

19 Claims, 16 Drawing Sheets

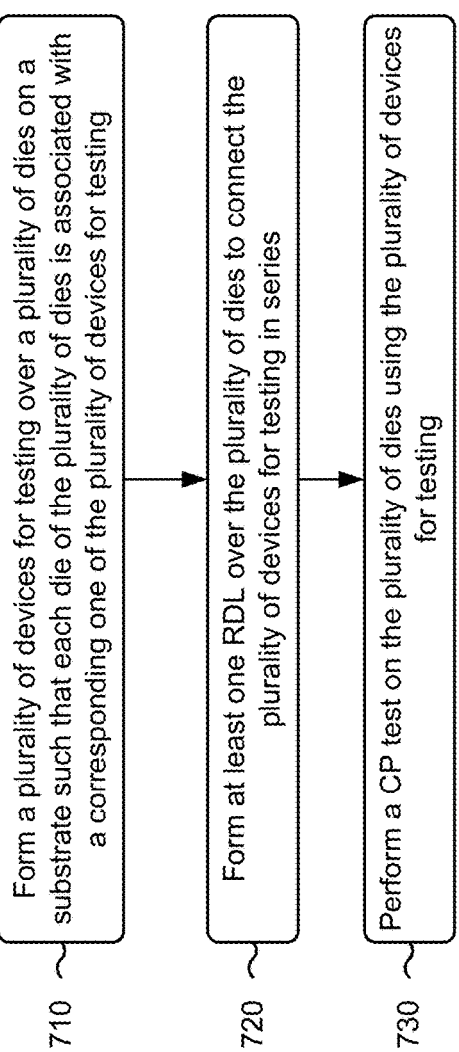

710 — Form a plurality of devices for testing over a plurality of dies on a substrate such that each die of the plurality of dies is associated with a corresponding one of the plurality of devices for testing 720 — Form at least one RDL over the plurality of dies to connect the plurality of devices for testing in series 730 — Perform a CP test on the plurality of dies using the plurality of devices for testing

Perform a CP test on a plurality of dies using a plurality of devices for testing and using one or more RDLs that connects the plurality of devices for testing in series

810

Store a sequence of bits indicative of results of the CP test for the plurality of dies

820

800

SEMICONDUCTOR TESTING DEVICE AND METHOD OF OPERATING THE SAME

CROSS-REFERENCE TO RELATED APPLICATIONS

This application is a continuation of U.S. patent application Ser. No. 17/664,771, filed May 24, 2022, and entitled "SEMICONDUCTOR TESTING DEVICE AND METHOD OF OPERATING THE SAME," which claims priority to U.S. Provisional Patent Application No. 63/305,726, filed on Feb. 2, 2022, and entitled "SEMICONDUCTOR TESTING STRUCTURES AND ASSOCIATED METHODS," the contents of which are incorporated herein by reference in their entireties.

BACKGROUND

Three-dimensional integrated circuits (3DICs) are a recent development in semiconductor packaging in which multiple semiconductor dies are stacked upon one another (e.g., using package-on-package (POP) and system-in-package (SiP) packaging techniques). 3DICs provide improved integration density and other advantages, such as faster speeds and higher bandwidth, because of decreased length of interconnects between the stacked dies. After a plurality of dies (e.g., a system on integrated circuit (SoIC) die or another type of die) are stacked together to form a stacked semiconductor device, a circuit probe (CP) or another type of wafer acceptance test (WAT) is performed on the entire stacked semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H are diagrams of an example implementation described herein.

FIG. 7 is a flowchart of an example process associated with forming semiconductor structures described herein.

DETAILED DESCRIPTION

Figure 1A:
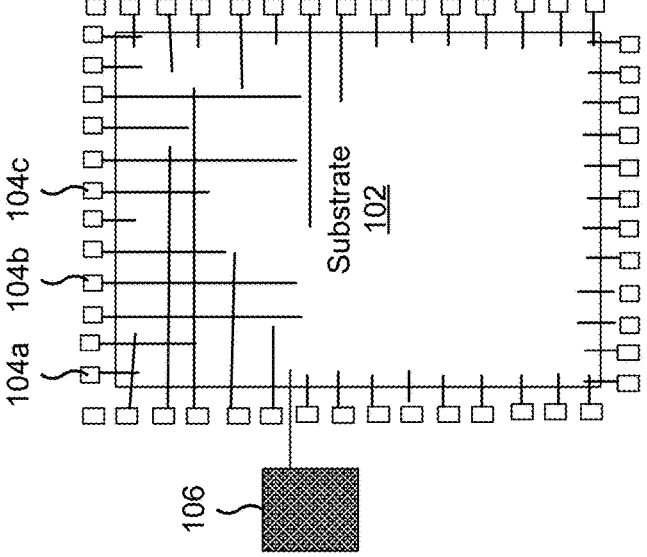
FIGS. 1A and 1B are diagrams of example semiconductor structures described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more types of tests may be performed to test one or more semiconductor dies of a semiconductor device. Testing may be performed to determine semiconductor die yield, to identify failed semiconductor dies, to test and/or verify one or more performance parameters, and/or to verify semiconductor die operation, among other examples. Examples of semiconductor device testing include a circuit probe (CP) test and/or another type of wafer acceptance test (WAT) or semiconductor device test.

In some cases, semiconductor testing structures are formed for a semiconductor device at a final step or at a final stage in a manufacturing process for the semiconductor device. As a result, the semiconductor structures may fail to provide a robust check of performance and/or yield for the semiconductor device and may fail to provide sufficiently early detection of device failures for the semiconductor device. Moreover, the incorporation of semiconductor testing structures in the semiconductor device is limited due to constraints, such as manufacturing time and cost. These issues become worse as the quantity of dies formed on a single semiconductor wafer increases, such as where gross dies per wafer (GDPW) approaches 10,000 dies or greater. Moreover, the available area for semiconductor testing structures on the semiconductor wafer decreases as GDPW increases, which limits testing pad configuration options for the semiconductor testing structures formed on the semiconductor wafer.

Some implementations described herein provide techniques and apparatuses for using a plurality of devices for testing, connected in series using a redistribution structure (e.g., formed of one or more redistribution layers (RDL(s)), to perform a semiconductor device test on a plurality of dies. As a result, the semiconductor device test may support thousands of GDPW or greater (e.g., 10,000 dies or greater). Furthermore, the RDL(s) may be removed such that a manufacturing process for a semiconductor device including the plurality of dies may continue.

In some implementations, the devices for testing corresponding to the dies may execute the semiconductor device test sequentially. Accordingly, test data may be generated and may include a bit sequence, where a first bit in the bit sequence indicates an overall outcome for the test and one or more subsequent bits in the bit sequence indicate respective outcomes for each semiconductor die or for each line of the semiconductor device test.

FIG. 1A is a diagram of an example implementation 100 associated with pad structures. As shown in FIG. 1A, example implementation 100 includes a chiplet formed on a substrate 102. The substrate 102 may be silicon (Si), germanium (Ge), gallium (Ga), zinc (Zn), indium (In), an alloy and/or an oxide thereof, a laminated printed circuited board (PCB), a ceramic, and/or another type of material that supports the chiplet.

The chiplet may include a plurality of dies, where the plurality of dies are interconnected to form a semiconductor device. The chiplet may be a memory device (e.g., a static random access memory (SRAM), a dynamic random access memory (DRAM)), a logic device, a processor, an input/output device (e.g., an integrated fanout (InFo) device or another type of input/output device), a system on integrated circuit (SoIC) device, a chip on wafer on substrate (CoWoS) device, a three-dimensional inter-chip (3D IC) device, a micro electromechanical system (MEMS) device, and/or another type of semiconductor device in which dies are stacked or vertically arranged. Each die may include a system on chip (SoC), a logic device, a sensor device, a processor device, and/or another type of semiconductor device.

In order to perform a CP test and/or another type of WAT or semiconductor device test on the chiplet, a CP test apparatus 106 may be connected to the chiplet. Based on the outcome of the CP test, as shown in FIG. 1A, each die of the chiplet (or at least each die indicated as functional by the CP test) may be connected to a respective pad 104 (e.g., pad 104*a*, pad 104*b*, pad 104*c*, and so on). Each pad 104 may include a via assembly formed of stacked stud bump connectors. For example, the stud bump connectors may be formed using ball bonding equipment (e.g., as used for wire bonding). The stud bump connectors may be formed, for example, of copper, gold, and/or another type of metal. Stud bumps are stacked one atop another to form the pad 104. The lines in FIG. 1A show the locations of the pads 104*a*, 104*b*, 104*c*, and so on over the substrate 102 of dies. The layout shown in FIG. 1A is an example and may be adjusted according to other schematics for the chiplet.

Accordingly, the pads 104*a*, 104*b*, 104*c*, and so on may be used to provide input signals to corresponding devices. For example, when the chiplet includes a memory device, the pads 104*a*, 104*b*, 104*c*, and so on may be used to provide inputs bits that are to be written to memory cells of the chiplet. In another example, when the chiplet includes a processing device, the pads 104*a*, 104*b*, 104*c*, and so on may be used to provide inputs bits that are to be added, multiplied, and/or otherwise acted upon. Additionally, or alternatively, the pads 104*a*, 104*b*, 104*c*, and so on may be used to receive output signals from the corresponding devices. For example, when the chiplet includes a memory device, the testing pads 104*a*, 104*b*, 104*c*, and so on may be used to receive output bits that are read from memory cells of the chiplet. In another example, when the chiplet includes a processing device, the pads 104*a*, 104*b*, 104*c*, and so on may be used to receive output bits from arithmetic operations performed.

In some implementations, control circuits may be formed under (or otherwise abutting) the pads 104*a*, 104*b*, 104*c*, and so on. Accordingly, the control circuits may provide input signals and/or receive output signals, as described above. For example, a device for testing corresponding to a die may execute an instruction, which causes the device for testing to request an input signal from (or to output an output signal to) a control circuit abutting the corresponding pad for the die.

Figure 1B:
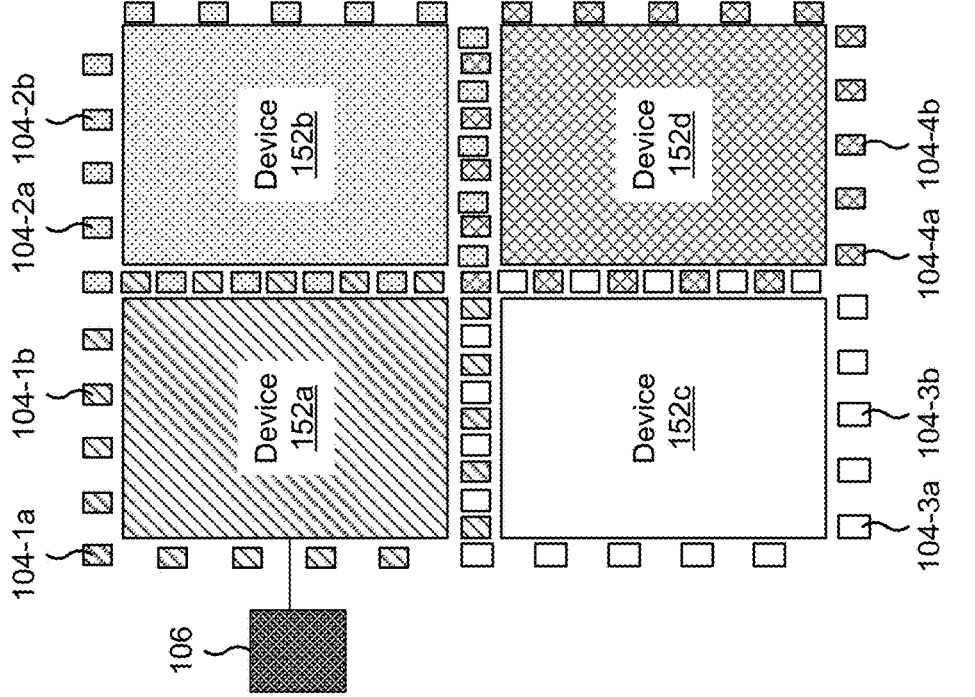

FIG. 1B is a diagram of an example implementation 150 associated with pad structures. Example implementation 150 is similar to example implementation 100 but includes a plurality of semiconductor devices (e.g., devices 152*a*, 152*b*, 152*c*, and 152*d* as shown in FIG. 1B) formed on the substrate 102.

As shown in FIG. 1B, each die of the device 152*a* may be connected to a respective pad 104-1 (e.g., pad 104-1*a*, pad 104-1*b*, and so on), and each die of the device 152*b* may be connected to a respective pad 104-1 (e.g., pad 104-2*a*, pad 104-2*b*, and so on). Similarly, each die of the device 152*c* may be connected to a respective pad 104-3 (e.g., pad 104-3*a*, pad 104-3*b*, and so on), and each die of the device 152*d* may be connected to a respective pad 104-4 (e.g., pad 104-4*a*, pad 104-4*b*, and so on). The lines in FIG. 1B show the locations of the pads 104-1, 104-1*b*, 104-2*a*, 104-2*b*, 104-3*a*, 104-3*c*, 104-4*a*, 104-4*b*, and so on over each die of the substrate 102. The layout shown in FIG. 1B is an example and may be adjusted according to other schematics for the chiplet.

As indicated above, FIGS. 1A and 1B are provided as examples. Other examples may differ from what is described with regard to FIGS. 1A and 1B.

Figure 2:
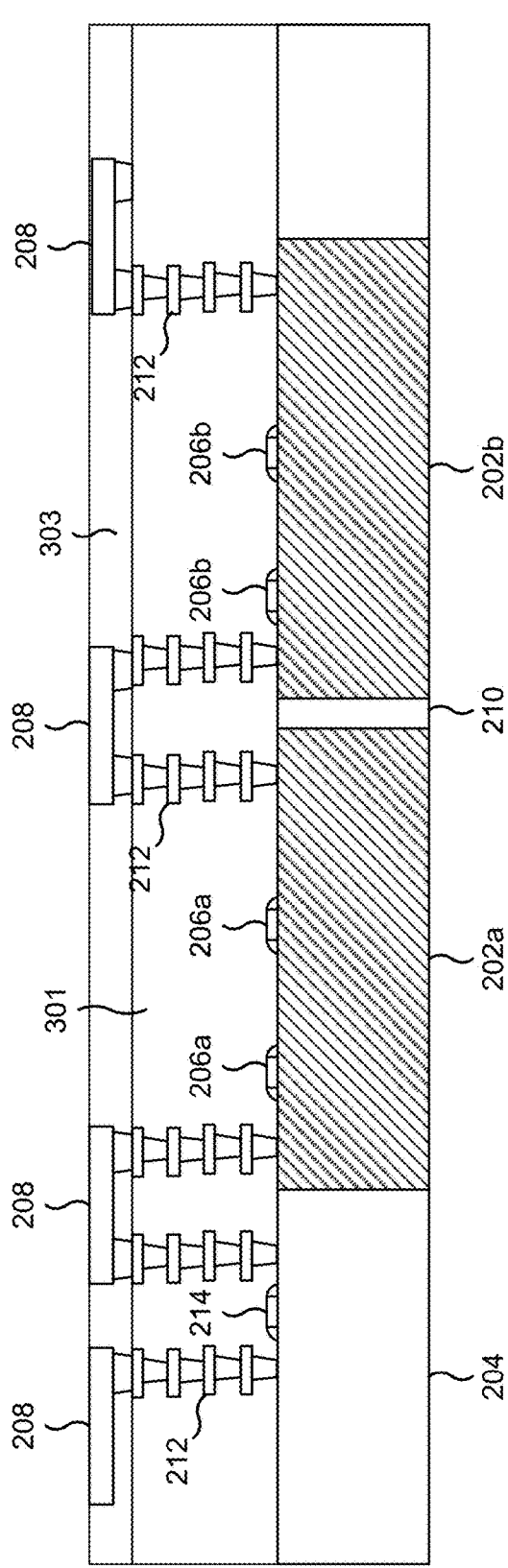
FIG. 2 is a diagram of an example semiconductor structure described herein.

FIG. 2 is a diagram of an example implementation 200 associated with an RDL for semiconductor device testing. As shown in FIG. 2, example implementation 200 includes a substrate (e.g., shown as a first portion 202*a* and a second portion 202*b* in FIG. 2) formed on a substrate. The substrate may be silicon (Si), germanium (Ge), gallium (Ga), zinc (Zn), indium (In), an alloy and/or an oxide thereof, a laminated PCB, a ceramic, and/or another type of material that supports the substrate 202 of dies. Additionally, at least a portion 204 of the substrate may be separate from the dies.

As shown in FIG. 2, each die may be associated with a corresponding device for testing 206. In example implementation 200, the die formed on portion 202*a* is associated with the device for testing 206*a*, and the die formed on portion 202*b* is associated with the device for testing 206*b*. Each device for testing may include a control circuit (e.g., a microprocessor and/or another special-purpose circuit) to execute lines of CP test (and/or another type of WAT or semiconductor device test) provided by a CP test apparatus (e.g., as described herein). Accordingly, each device for testing may be electrically connected to the corresponding die at a back end of line (BEOL) connection and/or another conductive area that allows the device for testing to apply voltages to semiconductor structures (e.g., transistors) of the corresponding die. For example, the semiconductor structures of the corresponding die may include a field-effect transistor (FinFET) structure, a gate-all-around (GAA) structure, a two-dimensional material (e.g., graphene) device, a gate electrode structure (e.g., formed of polysilicon, silicon (Si), titanium (Ti), tantalum (Ta), aluminum (Al), tungsten (W), zinc (Zn), indium (In), gallium (Ga), and/or germanium (Ge), optionally bonded with nitrogen (N) to form a nitride), a gate dielectric structure (e.g., formed of a silicon oxide, such as $SiO_2$, a silicon oxynitride, such as SiON, an SiCON film, a hafnium oxide, such as HfO, lanthanum (La), and/or zinc (Zn)), and/or a source/drain structure (e.g., formed using boron (B), phosphorous (P), arsenic (As), indium (In), silicon (Si), and/or antimony (Sb), optionally bonded with nitrogen (N) to form a nitride, oxygen (O) to form an oxide, and/or carbon (C) to form a carbide), among other examples.

As shown in FIG. 2, the device for testing 206*a* and the device for testing 206*b* may each include physically separate components (e.g., different circuits connected to different conductive areas of the corresponding die over portion 202a and the corresponding die over portion 202b, respectively). Additionally, or alternatively, at least one of the device for testing 206a or the device for testing 206b may include a single component (e.g., a single circuit connected to one or more conductive areas of the corresponding die on portion 202a or the corresponding die on portion 202b, respectively).

As further shown in FIG. 2, the devices for testing 206a and 206b are connected in series using at least one RDL 208. As shown in FIG. 2, the RDL(s) 208 may include a plurality of RDLs within a dielectric layer 303. Accordingly, the RDL(s) 208 may electrically connect the dies (e.g., formed on portions 202a and 202b) such that the devices for testing 206a and 206b may execute lines of a CP test (and/or another type of WAT or semiconductor device test) in series (e.g., as described in connection with FIG. 5). The RDL(s) 208 may be formed of aluminum (Al), silicon (Si), copper (Cu), titanium (Ti), tantalum (Ta), nickel (Ni), cobalt (Co), and/or tungsten (W), optionally bonded with nitrogen (N) to form a nitride, oxygen (O) to form an oxide, and/or carbon (C) to form a carbide, among other examples.

In some implementations, the dies (e.g., formed on portions 202a and 202b) are electrically and/or physically insulated via an isolation structure 210. For example, the isolation structure 210 may be formed via local oxidation of silicon (LOCOS), shallow trench isolation (STI), deep trench isolation (DTI), and/or forbidden area formation, among other examples. Additionally, or alternatively, the dies (e.g., formed on portions 202a and 202b) may be electrically connected via an interconnect. For example, the dies (e.g., formed on portions 202a and 202b) may be connected via direct bond (DB) and/or direct bond interconnect (DBI), among other examples. Additionally, or alternatively, the interconnect may comprise a porous structure and/or an etch stop layer (ESL), among other examples. Additionally, or alternatively, the interconnect may be formed of aluminum (Al), silicon (Si), copper (Cu), titanium (Ti), tantalum (Ta), nickel (Ni), cobalt (Co), and/or tungsten (W), optionally bonded with nitrogen (N) to form a nitride, oxygen (O) to form an oxide, and/or carbon (C) to form a carbide, among other examples.

In some implementations, the RDL(s) 208 may connect to the dies (e.g., formed on portions 202a and 202b) via interconnectors 212. The interconnectors 212 may be solder bumps and/or another type of connector, such as copper bumps, copper pillars, and/or micro-bumps, among other examples. As used herein, "solder" includes lead-containing materials, such as lead-tin compositions, and lead-free solder materials, such as SnAgCu ("SAC") and eutectic materials. The interconnectors 212 may be formed in a dielectric layer 301 that is separate from the dielectric layer 303. Alternatively, the dielectric layers 301 and 303 may be portions of the same dielectric layer.

By forming the devices for testing 206a and 206b on the corresponding dies (e.g., formed on portions 202a and 202b), respectively, and connecting the devices for testing 206a and 206b in series using the RDL(s) 208, a semiconductor device test may be performed on each die. As a result, the semiconductor device test may support thousands of GDPW or greater (e.g., 10,000 dies or greater).

Example implementation 200 may be combined with example implementation 100 or example implementation 150. For example, each device for testing 206a and 206b (or at least each one that passes a CP test) may connect (electrically) to a corresponding pad for the corresponding die. Accordingly, the corresponding pad may provide input signals and/or receive output signals for instructions executed by the corresponding device for testing 206a or 206b.

As further shown in FIG. 2, an initial testing module 214 may be formed on the portion 204 of the substrate that does not include the dies (e.g., formed on portions 202a and 202b). The initial testing module 214 may include a circuit that collates results from the testing modules 206a and 206b, as described in connection with FIGS. 4 and 5. Some implementations may include forming the initial testing module 214 on the portion 202a or the portion 202b. Some implementations may include forming the initial testing module 214 external to the substrate.

As indicated above, FIG. 2 is provided as an example. Other examples may differ from what is described with regard to FIG. 2.

Figure 3A:
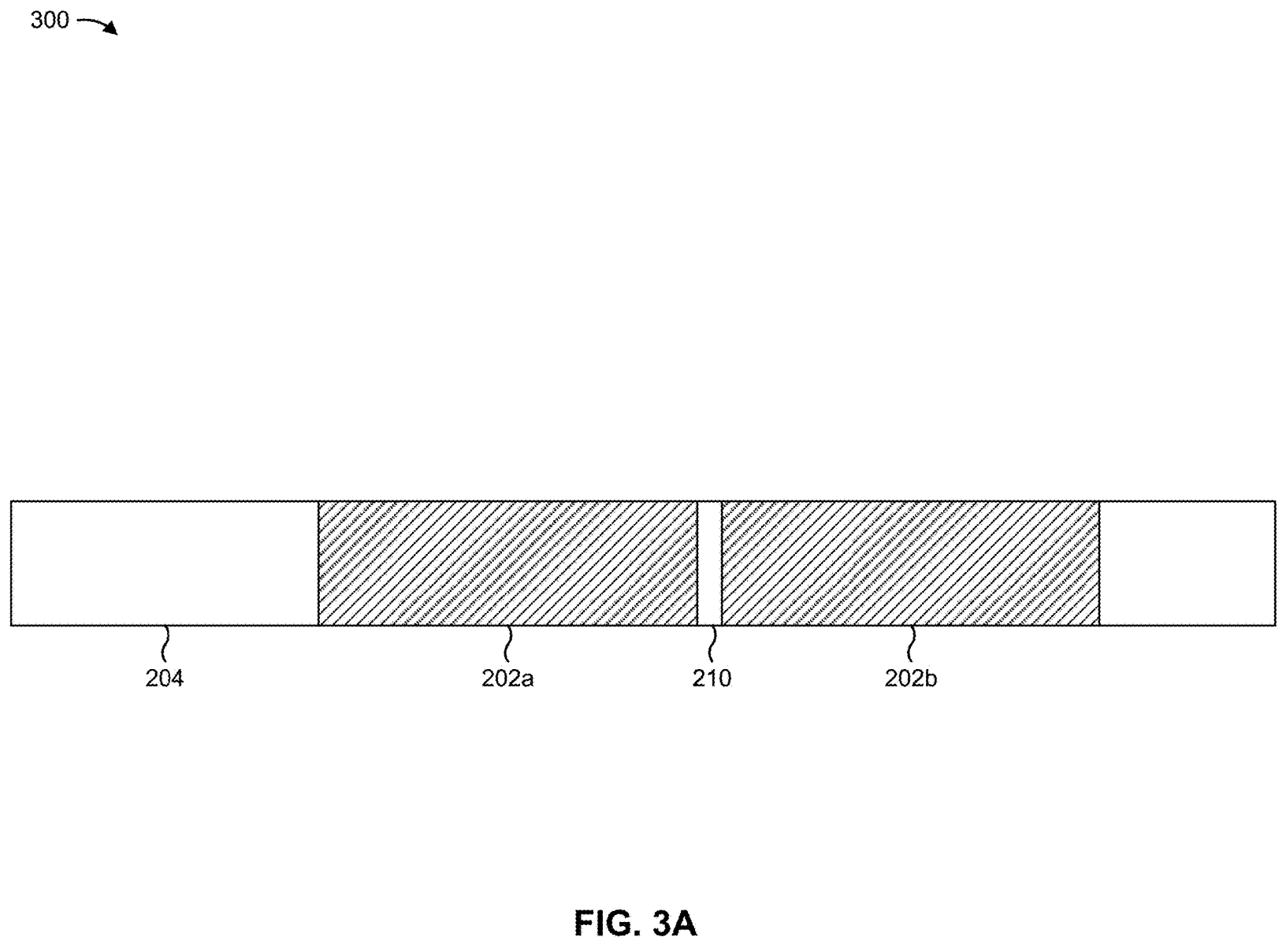
Figure 3B:
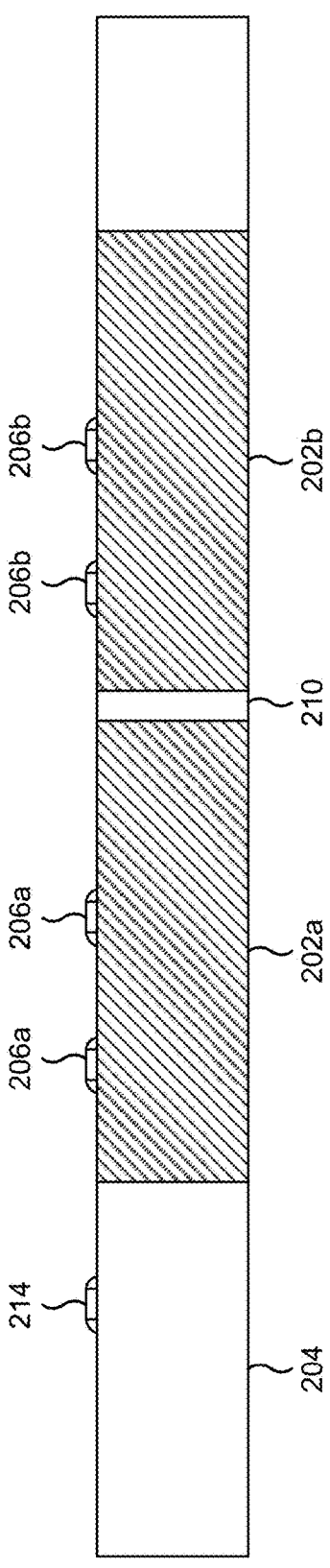

FIGS. 3A-3H are diagrams of an example implementation 300 associated with forming semiconductor structures for semiconductor device testing. As shown in FIG. 3A, example implementation 300 includes a substrate (e.g., shown as a first portion 202a and a second portion 202b in FIG. 2) of a plurality of dies. The substrate may be silicon (Si), germanium (Ge), gallium (Ga), zinc (Zn), indium (In), an alloy and/or an oxide thereof, a laminated PCB, a ceramic, and/or another type of material that supports the plurality of dies. Additionally, at least a portion 204 of the substrate may be separate from the plurality of dies (e.g., formed on portions 202a and 202b). In some implementations, the dies are electrically and/or physically insulated via an isolation structure 210 (e.g., as described in connection with FIG. 2).

As shown in FIG. 3B, a plurality of devices for testing may be formed over the substrate. For example, a deposition tool may deposit a device for testing 206a corresponding to the die on the portion 202a, a device for testing 206b corresponding to the die on the portion 202b, and so on. Additionally, in some implementations, the deposition tool may deposit an initial testing module 214 on the portion 204 of the substrate that does not include the dies (e.g., formed on portions 202a and 202b). Alternatively, the deposition tool may deposit the initial testing module 214 on portion 202a and/or portion 202b.

In some implementations, the deposition tool is a semiconductor processing tool that includes a semiconductor processing chamber and one or more devices capable of depositing various types of materials onto a substrate. In some implementations, the deposition tool includes a spin coating tool that is capable of depositing a photoresist layer on a substrate such as a wafer. In some implementations, the deposition tool includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool includes a physical vapor deposition (PVD) tool, such as a sputtering tool or another type of PVD tool. In some implementations, the deposition tool includes an epitaxial tool that is configured to form layers and/or regions of a device by epitaxial growth. Additionally, or alternatively, the deposition tool is a bonding tool that adheres (via an adhesive, pressure bonding, welding, and/or another adhering technique) the devices for testing (which may comprise or special-purpose processing circuits) to the dies.

Figure 3C:
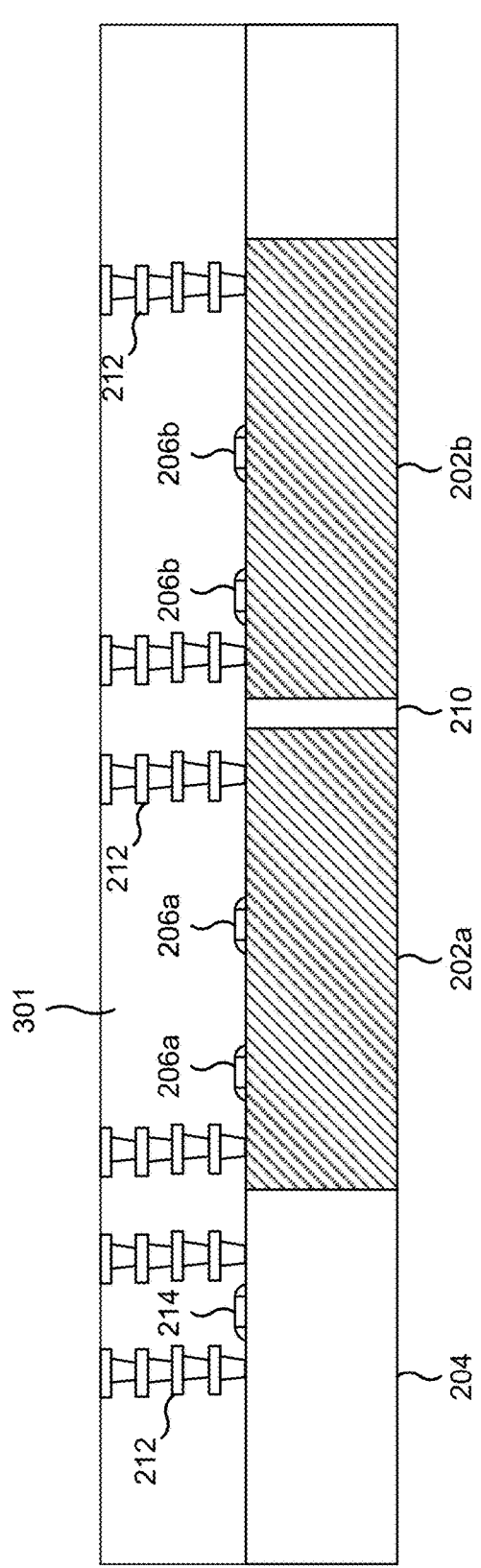

As shown in FIG. 3C, a plurality of interconnectors 212 may be formed on the dies (e.g., formed on portions 202a and 202b). For example, the deposition tool may deposit the interconnectors 212 in order to electrically connect the devices for testing 206a and 206b in series (e.g., in a closed loop with the initial testing module 214, as described in connection with FIG. 4).

Figure 3D:
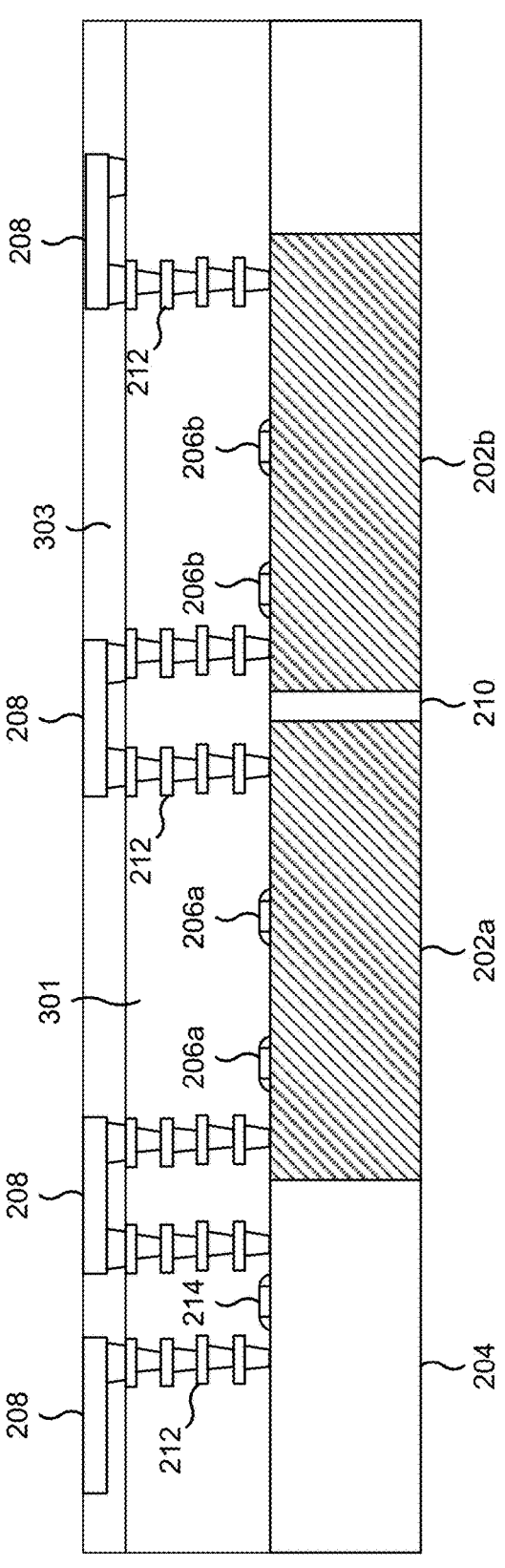

As shown in FIG. 3D, at least one RDL 208 may be formed to connect the devices for testing 206a and 206b in series (e.g., via the interconnectors 212). For example, the deposition tool may deposit the RDL(s) 208 in order to electrically connect the devices for testing 206a and 206b in a closed loop with the initial testing module 214, as described in connection with FIG. 4.

Accordingly, a CP test apparatus (e.g., as described in connection with FIG. 4) may be connected to the initial testing module 214 (e.g., via the RDL(s) 208) and execute a CP test (and/or another type of WAT or semiconductor device test). For example, the CP test apparatus may transmit instructions, line by line, to the devices for testing 206a and 206b via the initial testing module 214 and the RDL 208. As a result, the CP test is test performed on each die in sequence. As a result, the CP test may support thousands of GDPW or greater (e.g., 10,000 dies or greater). The CP test apparatus may receive results via the initial testing module 214 (e.g., as described in connection with FIG. 5). In some implementations, the CP test apparatus may provide additional input signals and/or receive additional output signals via testing pads (e.g., as described in connection with FIGS. 1A and 1B).

Figure 3E:
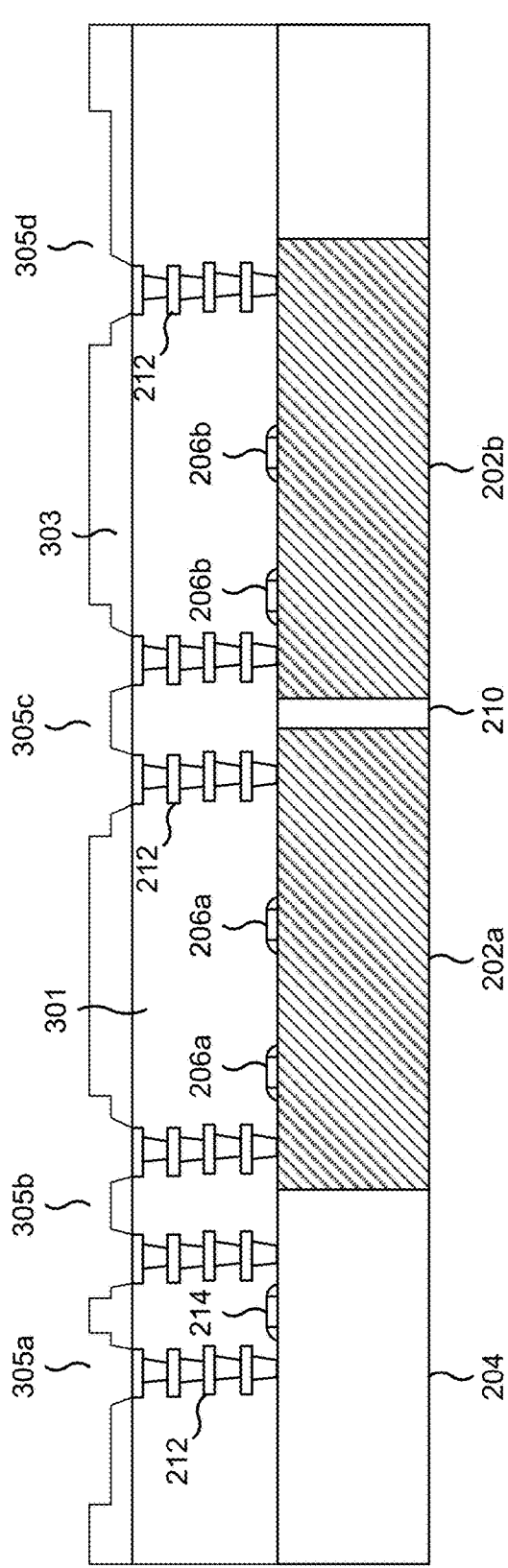

As shown in FIG. 3E, the RDL 208 may be removed. For example, an etch tool may remove the RDL 208. In some implementations, the etch tool is a semiconductor processing tool that is capable of etching various types of materials of a substrate, wafer, or semiconductor device. For example, the etch tool may include a wet etch tool, a dry etch tool, and/or the like. In some implementations, the etch tool includes a chamber that is filled with an etchant, and the substrate is placed in the chamber for a particular time period to remove particular amounts of one or more portions of the substrate. In some implementations, the etch tool may etch one or more portions of the substrate using a plasma etch or a plasma-assisted etch, which may involve using an ionized gas to isotropically or directionally etch the one or more portions. Additionally, or alternatively, the etch tool is a chemical mechanical planarization (CMP) tool and/or another type of planarization tool that polishes or planarizes a layer or surface of deposited or plated material. Accordingly, the RDL 208 may be removed via polishing.

In some implementations, and as further shown in FIG. 3E, removing the RDL(s) 208 may leave recesses (e.g., recesses 305a, 305b, 305c, and 305d) in dielectric layer 303. Accordingly, the interconnectors 212 may be exposed.

Figure 3F:
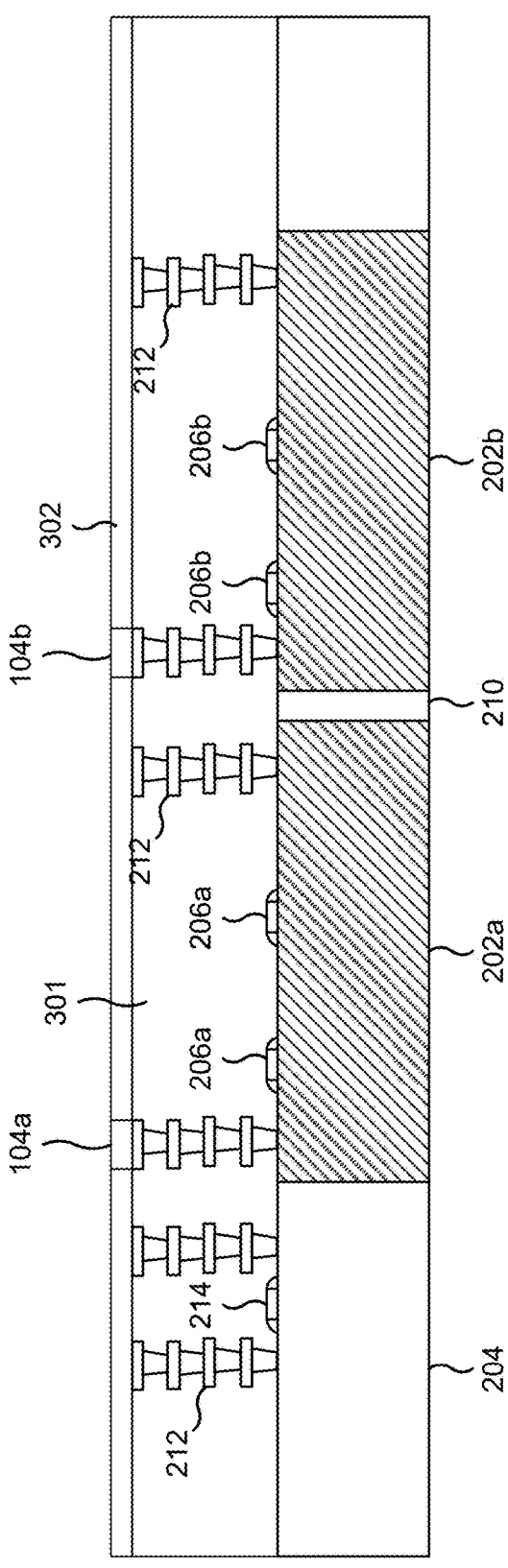

As shown in FIG. 3F, a plurality of pads may be formed over the plurality of dies. For example, the deposition tool may deposit a pad 104a corresponding to the die on portion 202a, a pad 104b corresponding to the die on portion 202b, and so on. In some implementations, as shown in FIG. 3F, the dielectric layer 303 is removed, and dielectric layer 302 is deposited. Accordingly, the pads 104a and 104b may be formed in dielectric layer 302 according to a different layout than the RDL(s) 208 that were removed. Although shown using a single pad for each die, one or more of the dies may have a plurality of pads formed thereon, depending on a quantity of input and/or output signals associated with the one or more dies. In some implementations, as shown in FIG. 3F, the pads may be formed in at least a portion of the recesses left by removal of the RDL(s) 208.

The deposition tool may form the pads based on results of the CP test. For example, the deposition tool may form pads over dies that pass the CP test (e.g., determined based on a sequence of bits, as described in connection with FIG. 5). Dies that fail the CP test may be isolated by not having pads formed thereon. Additionally, or alternatively, the etch tool may remove connections to the dies that failed the CP test (e.g., by removing interconnectors 212 associated with the failed dies, as described in connection with FIG. 3F).

Figure 3G:
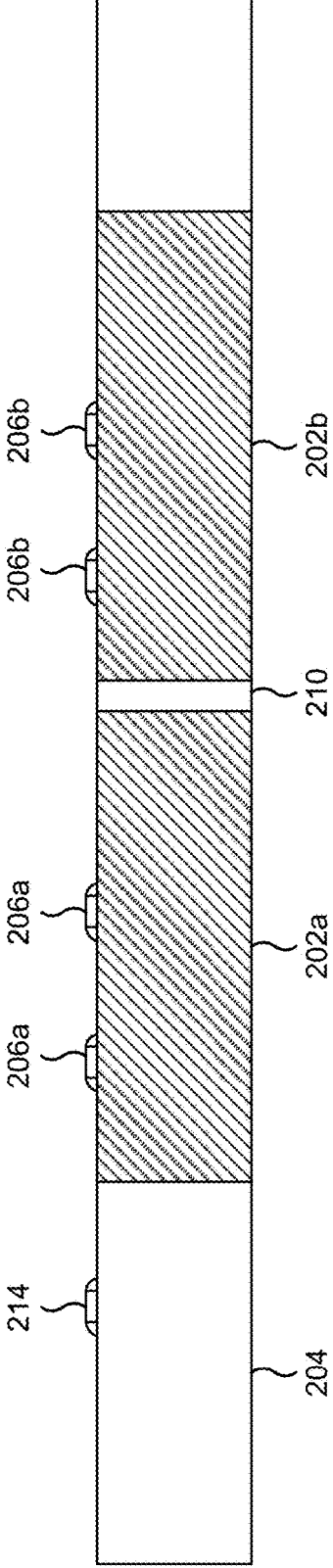

In some implementations, and as shown in FIG. 3G, the interconnectors 212 may also be removed. For example, the original interconnectors 212 may be formed for the trst, and the etch tool may remove the interconnectors 212. As an alternative, the interconnectors 212 may be used to connect the dies (e.g., formed on portions 202a and 202b) to a control circuit and/or another semiconductor device. Accordingly, the interconnectors 212 may be removed after the RDL(s) 208 are removed, and other interconnector structures will be formed for the final products.

Figure 3H:
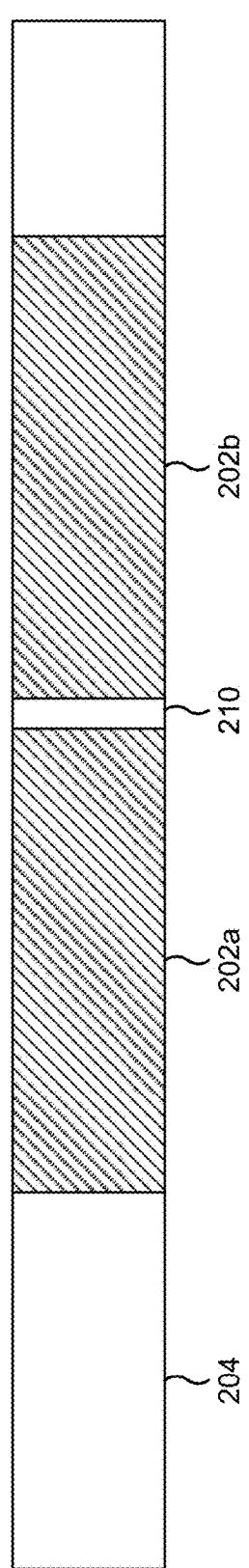

In some implementations, and as shown in FIG. 3H, one or more of the devices for testing 206 and/or the initial testing module 214 may be removed. For example, the etch tool may remove the device for testing 206a corresponding to the die on portion 202a or the device for testing 206b corresponding to the die on portion 202b (e.g., based on which devices for testing failed the CP test). Additionally, or alternatively, in some implementations, the etch tool may remove the initial testing module 214.

Accordingly, a manufacturing process for a chiplet including the plurality of dies may continue. Thus, by using techniques as described in connection with FIGS. 3A-3H, the plurality of dies may be tested with less delay imposed on the manufacturing process for the chiplet than if the CP test apparatus were to be moved from die to die.

As indicated above, FIGS. 3A-3G are provided as an example. Other examples may differ from what is described with regard to FIGS. 3A-3G.

Figure 4:
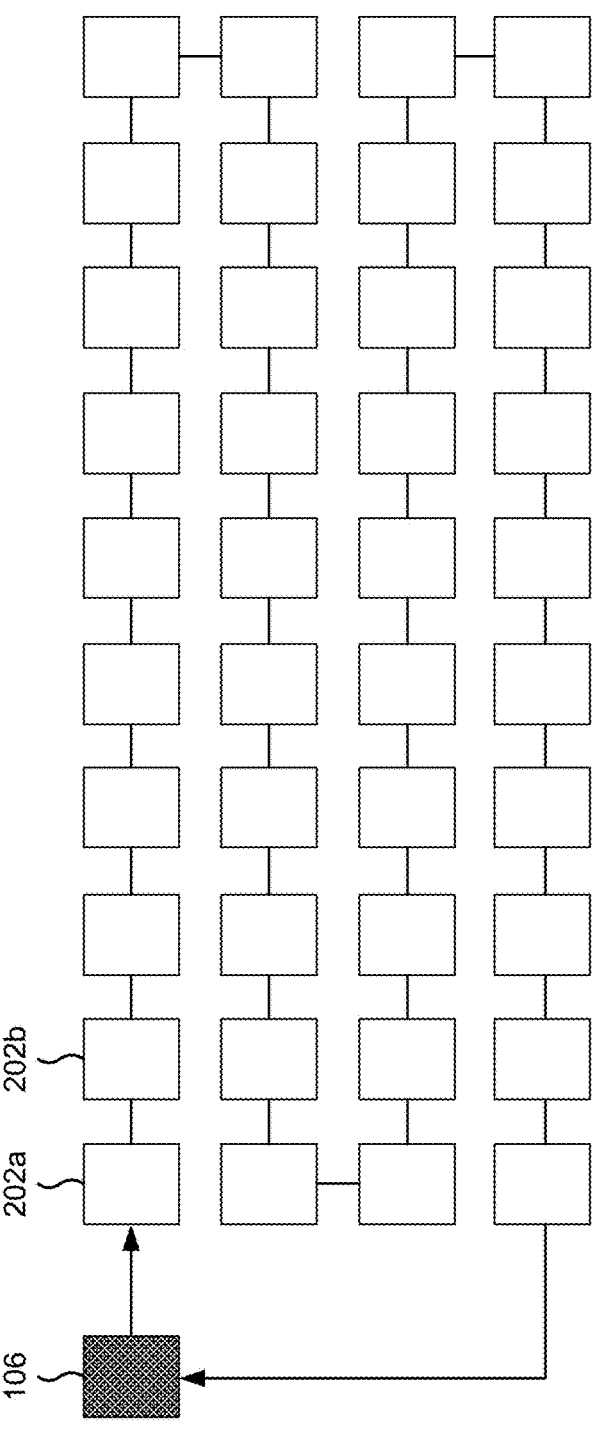
FIG. 4 is a diagram of an example series connection described herein.

FIG. 4 is a diagram of an example implementation 400 associated with performing a semiconductor device test in series. As shown in FIG. 4, example implementation 400 includes a substrate (e.g., shown as a first portion 202a and a second portion 202b in FIG. 2) of a plurality of dies. The substrate may be silicon (Si), germanium (Ge), gallium (Ga), zinc (Zn), indium (In), an alloy and/or an oxide thereof, a laminated PCB, a ceramic, and/or another type of material that supports the plurality of dies.

The plurality of dies may have corresponding devices for testing, as described in connection with FIG. 2. Accordingly, one or more RDLs may connect the devices for testing in series, as shown in FIG. 4.

Additionally, a CP testing apparatus 106 may be connected to a beginning of the series and to the end of the series. As a result, the CP testing apparatus 106 may form a closed loop with the devices for testing. In other implementations, and as described in connection with FIG. 2, an initial testing module may be used to form the closed loop, and the CP testing apparatus 106 may connect to the initial testing module.

Because the devices for testing are connected in series, the devices for testing may execute lines of a CP test (and/or another type of WAT or semiconductor device test) in sequence (e.g., as described in connection with FIG. 5). Additionally, because the devices for testing are in a closed loop, the CP testing apparatus 106 may receive (e.g., from the testing modules or from an initial testing module, as described above) a bit sequence indicating results of the test. In some implementations, the bit sequence may include an initial bit indicating an overall result and one or more subsequent bits indicating which line of the CP test resulted in failure. For example, the bit sequence "1000 0000" may indicate success at a corresponding die while the bit sequence "0000 0110" may indicate failure at the corresponding die on line 6. Additionally, or alternatively, the bit sequence may be associated with the plurality of dies. For example, the bit sequence may include an initial bit indicating an overall result and one or more subsequent bits indicating which dies, if any, failed. For example, the bit sequence "1000 0000" may indicate success while the bit sequence "0000 0010" may indicate failure at the sixth die in the series.

Based on which die(s) failed, either as indicated by the bit sequence or as determined based on which line is indicated as failed and which die was executing the line at the time of failure, the chiplet may be remediated. For example, failed dies may be isolated from other dies on the structure (e.g., by etching connections between the failed dies and the other dies). Additionally, or alternatively, BEOLs and/or other conductive surfaces associated with the failed dies may be left unconnected to a control circuit during manufacturing.

As indicated above, FIG. 4 is provided as an example. Other examples may differ from what is described with regard to FIG. 4.

Figure 5:
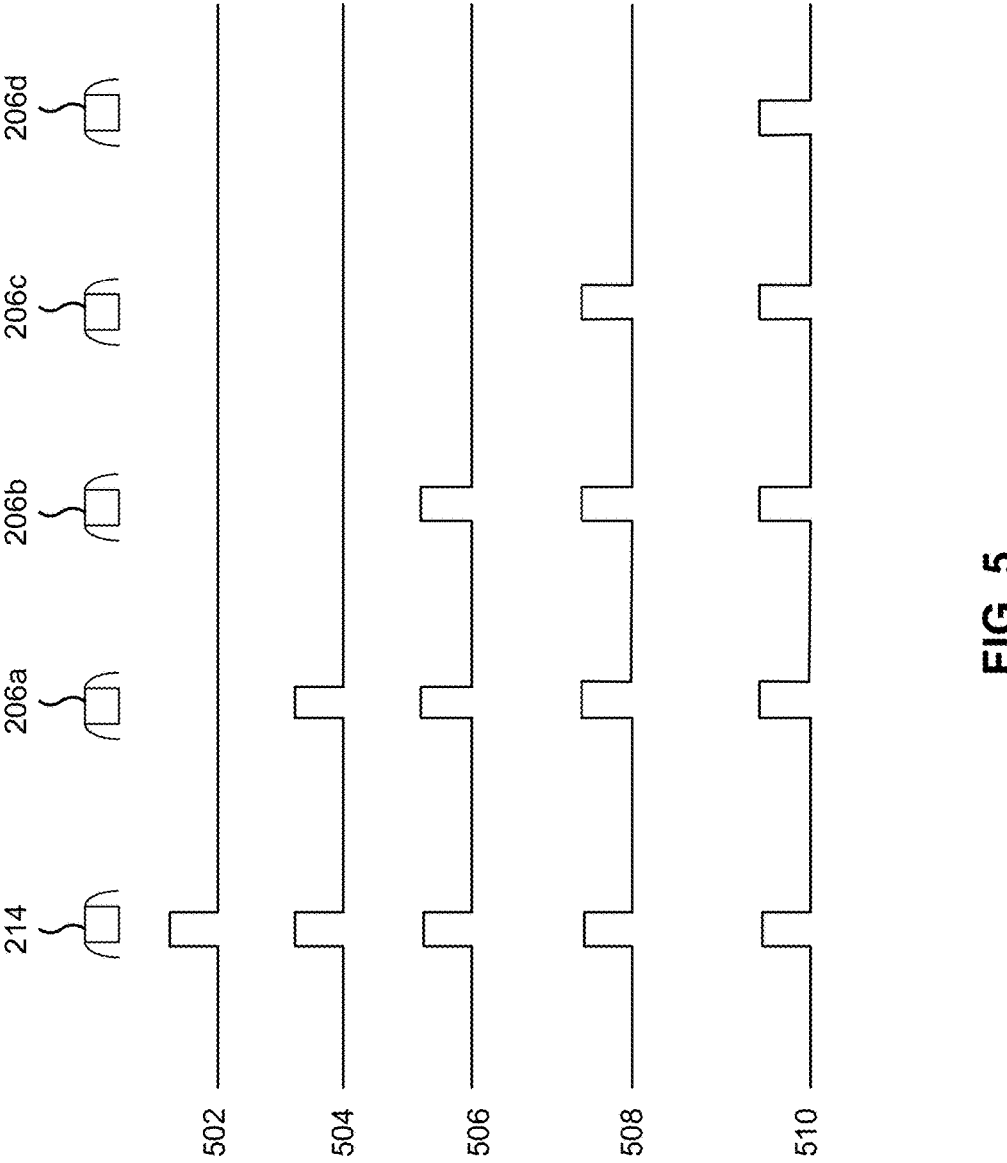
FIG. 5 is a diagram of an example bit sequence described herein.

FIG. 5 is a diagram of an example implementation 500 associated with performing a semiconductor device test in series. As shown in FIG. 5, example implementation 500 includes a plurality of testing modules (e.g., shown as an initial testing module 214 along with a device for testing 206a, a device for testing 206b, a device for testing 206c, a device for testing 206d, and so on in FIG. 5) corresponding to a plurality of dies (e.g., of a substrate). The substrate may be silicon (Si), germanium (Ge), gallium (Ga), zinc (Zn), indium (In), an alloy and/or an oxide thereof, a laminated PCB, a ceramic, and/or another type of material that supports the plurality of dies.

As described herein, the plurality of devices for testing are connected in series. Accordingly, a CP test apparatus (e.g., as described in connection with FIG. 4) may begin feeding instructions for a CP test (and/or another type of WAT or semiconductor device test) to the initial testing module 214, as shown by signal representation 502. The initial testing module 214 may propagate the instructions through the series of devices for testing. Accordingly, as shown by signal representation 504, the device for testing 206a may execute a first line of the CP test while the initial testing module 214 receives a second line of the CP test. Furthermore, as shown by signal representation 506, the device for testing 206a may execute the second line of the CP test while the device for testing 206b executes the first line of the CP test, and the initial testing module 214 receives a third line of the CP test. Similarly, as shown by signal representation 508, the device for testing 206a may execute the third line of the CP test while the device for testing 206b executes the second line of the CP test, the device for testing 206c executes the first line of the CP test, and the initial testing module 214 receives a fourth line of the CP test. Similarly, as shown by signal representation 510, the device for testing 206a may execute the fourth line of the CP test while the device for testing 206b executes the third line of the CP test, the device for testing 206c executes the second line of the CP test, the device for testing 206d executes the first line of the CP test, and the initial testing module 214 receives a fourth line of the CP test. This sequence may iterate until the initial testing module 214 has received a final line of the CP test, and the final line has propagated through the series of devices for testing such that each device for testing has executed each line of the CP test.

By using techniques as described in connection with FIG. 5, each semiconductor die is tested sequentially, which reduces latency in the manufacturing process caused by the test. Additionally, test data may be generated and may include a sequence of bits, as described in connection with FIG. 4. Using a sequence of bits conserves memory used to store results and allows for repair of the chiplet by identifying which lines of the test and/or which dies have caused failure.

As indicated above, FIG. 5 is provided as an example. Other examples may differ from what is described with regard to FIG. 5.

Figure 6:
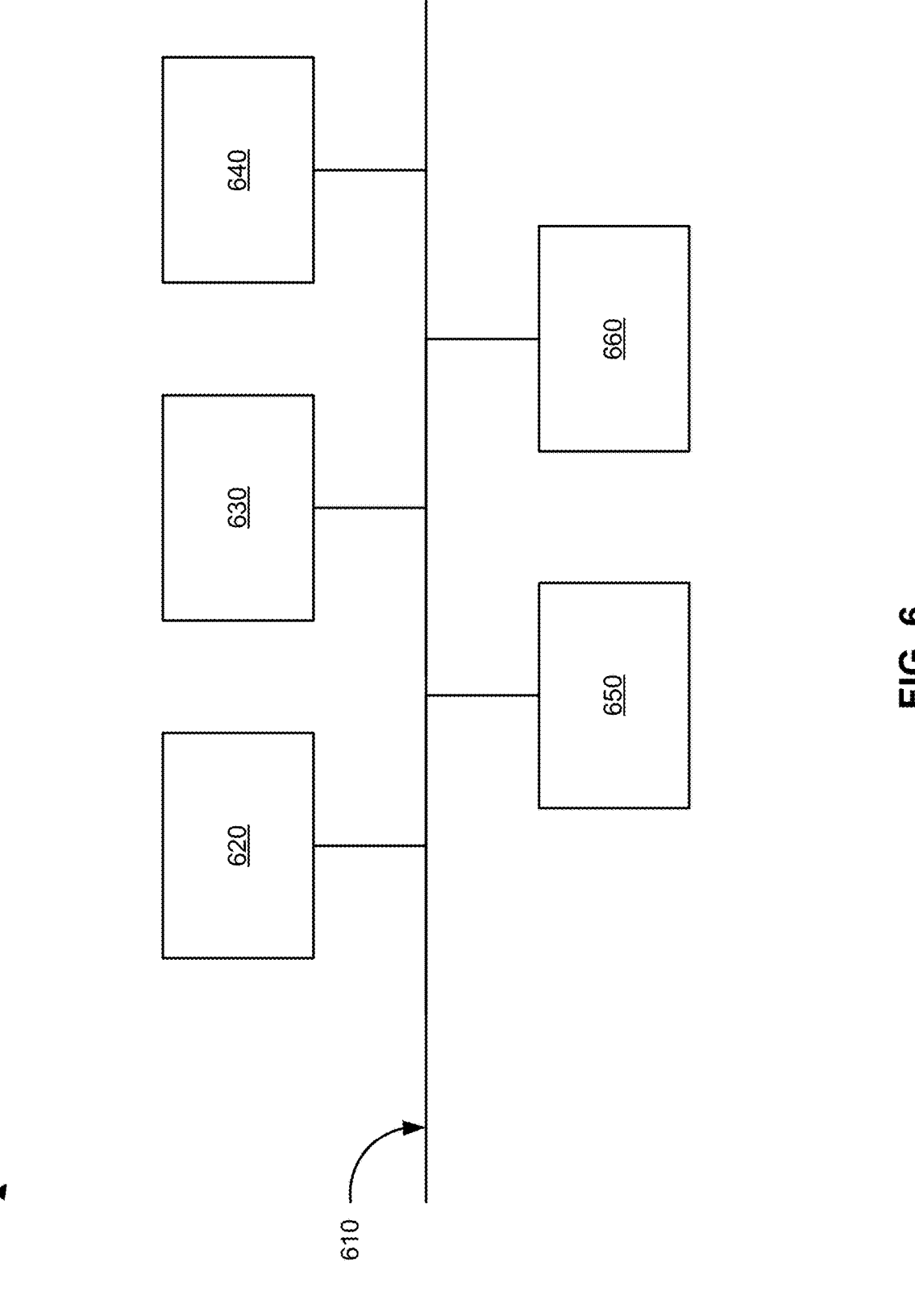
FIG. 6 is a diagram of example components of one or more devices of FIGS. 1A-5 described herein.

FIG. 6 is a diagram of example components of a device 600, which may correspond to one or more semiconductor formation tools, a CP test apparatus, and/or another device described herein. In some implementations, one or more semiconductor formation tools and/or a CP test apparatus may include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 associated with forming a semiconductor testing structure. In some implementations, one or more process blocks of FIG. 7 are performed by a device (e.g., one or more semiconductor formation tools). In some implementations, one or more process blocks of FIG. 7 are performed by another device or a group of devices separate from or including the device, such as a CP test apparatus (e.g., CP testing apparatus 106). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a plurality of devices for testing on a substrate of a plurality of dies (block 710). For example, the one or more semiconductor formation tools may form a plurality of devices for testing 206a/206b on a substrate 102 of a plurality of dies, as described herein. In some implementations, each die of the plurality of dies is associated with a corresponding one of the plurality of devices for testing 206a/206b.

As further shown in FIG. 7, process 700 may include forming at least one RDL over the plurality of dies to connect the plurality of devices for testing in series (block 720). For example, the one or more semiconductor formation tools may form at least one RDL 208 over the plurality of dies to connect the plurality of devices for testing 206a/206b in series, as described herein.

As further shown in FIG. 7, process 700 may include performing a CP test on the plurality of dies using the plurality of devices for testing (block 730). For example, the CP test apparatus 106 may perform a CP test on the plurality of dies using the plurality of devices for testing 206a/206b, as described herein.

Process 700 may include additional implementations, such as any single implementation or any combination of implementations described below and/or in connection with one or more other processes described elsewhere herein.

In a first implementation, process 700 further includes removing the at least one RDL 208 after the CP test is complete.

In a second implementation, alone or in combination with the first implementation, process 700 further includes forming an initial testing module 214 on the substrate 102 connected to the plurality of devices for testing 206a/206b.

In a third implementation, alone or in combination with one or more of the first and second implementations, the initial testing module 214 is formed over a portion 204 of the substrate 102 not including the plurality of dies.

In a fourth implementation, alone or in combination with one or more of the first through third implementations, process 700 further includes removing the initial testing module 214 after the CP test is complete.

In a fifth implementation, alone or in combination with one or more of the first through fourth implementations, the at least one RDL 208 includes one or more materials selected from aluminum, silicon, copper, titanium, tantalum, nitrogen, oxygen, carbon, nickel, cobalt, or tungsten.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
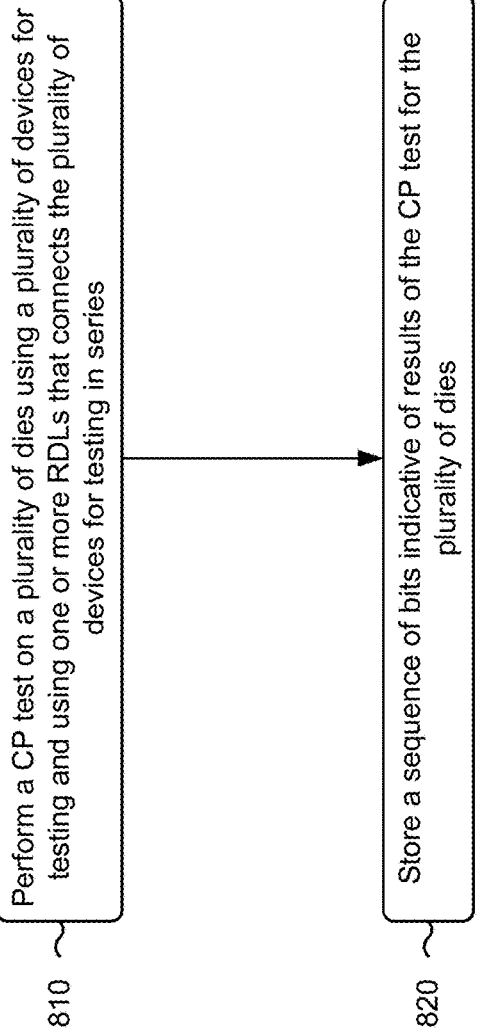
FIG. 8 is a flowchart of an example process associated with performing a circuit probe test.

FIG. 8 is a flowchart of an example process 800 associated with operating a semiconductor testing structure. In some implementations, one or more process blocks of FIG. 8 are performed by a device (e.g., CP test apparatus 106). In some implementations, one or more process blocks of FIG. 8 are performed by another device or a group of devices separate from or including the device, such as one or more semiconductor formation tools. Additionally, or alternatively, one or more process blocks of FIG. 8 may be performed by one or more components of device 600, such as processor 620, memory 630, input component 640, output component 650, and/or communication component 660.

As shown in FIG. 8, process 800 may include performing a CP test on a plurality of dies using a plurality of devices for testing and using one or more RDLs that connect the plurality of devices for testing in series (block 810). For example, the CP test apparatus 106 may perform a CP test on a plurality of dies using a plurality of devices for testing 206a/206b and using one or more RDLs 208 that connect the plurality of devices for testing 206a/206b in series, as described herein. In some implementations, each die of the plurality of dies is associated with a corresponding one of the plurality of devices for testing 206a/206b.

As further shown in FIG. 8, process 800 may include storing a sequence of bits indicative of results of the CP test for the plurality of dies (block 820). For example, the CP test apparatus 106 may store a sequence of bits indicative of results of the CP test for the plurality of dies, as described herein. An initial bit of the sequence of bits is indicative of an overall result, and one or more subsequent bits of the sequence of bits are indicative of which die, of the plurality of dies, is associated with failure.

Process 800 may include additional implementations, such as any single implementation or any combination of implementations described below and/or in connection with one or more other processes described elsewhere herein.

In a first implementation, process 800 further includes forming a plurality of pads 104a/104b, wherein each die of the plurality of dies is associated with a corresponding one of the plurality of pads 104a/104b, based on the sequence of bits.

In a second implementation, alone or in combination with the first implementation, performing the CP test includes connecting a CP test apparatus 106 to an initial testing module 214 and transmitting CP test signals using the CP test apparatus 106.

In a third implementation, alone or in combination with one or more of the first and second implementations, performing the CP test includes connecting a CP test apparatus 106 to a final device for testing 206*b* of the plurality of devices for testing, and receiving the sequence of bits using the CP test apparatus 106.

In a fourth implementation, alone or in combination with one or more of the first through third implementations, process 800 further includes performing an additional CP test on an additional plurality of dies using an additional plurality of devices for testing, where each die of the additional plurality of dies is associated with a corresponding one of the additional plurality of devices for testing, and using one or more additional RDLs that connect the plurality of additional devices for testing in series, where the one or more additional RDLs connect the plurality of additional devices for testing in series, separately from the plurality of devices for testing.

In a fifth implementation, alone or in combination with one or more of the first through fourth implementations, performing the CP test includes connecting a CP test apparatus 106 to a first initial testing module 214 connected to the plurality of devices for testing 206*a*/206*b*, and performing the additional CP test includes moving the CP test apparatus 106 to a second initial testing module connected to the additional plurality of devices for testing.

In a sixth implementation, alone or in combination with one or more of the first through fifth implementations, process 800 further includes removing the one or more RDLs 208 after the CP test is complete.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

In this way, a plurality of devices for testing, connected in series using one or more RDLs, are used to perform a semiconductor device test on a plurality of dies. As a result, the semiconductor device test may support thousands of GDPW or greater (e.g., 10,000 dies or greater). Furthermore, the RDL(s) may be removed after use. In some implementations, the devices for testing corresponding to the dies may execute the semiconductor device test sequentially. Accordingly, test data may be generated and may include a bit sequence, where a first bit in the bit sequence indicates an overall outcome for the test and one or more subsequent bits in the bit sequence indicate respective outcomes for each semiconductor dies or for each line of the semiconductor device test.

As described in greater detail above, some implementations described herein provide a device. The device includes a plurality of devices for testing formed on a substrate of a plurality of dies, where each die of the plurality of dies is associated with a corresponding one of the plurality of devices for testing. The device includes a plurality of pads, wherein each die of the plurality of dies is associated with a corresponding one of the plurality of pads.

As described in greater detail above, some implementations described herein provide a method. The method includes forming a plurality of devices for testing on a substrate of a plurality of dies, where each die of the plurality of dies is associated with a corresponding one of the plurality of devices for testing. The method further includes forming a redistribution layer (RDL) over the substrate to connect the plurality of devices for testing in series. The method includes performing a circuit probe (CP) test on the plurality of dies using the plurality of devices for testing.

As described in greater detail above, some implementations described herein provide a method. The method includes performing a circuit probe (CP) test on a plurality of dies using a plurality of devices for testing and using a redistribution layer (RDL) that connects the plurality of devices for testing in series, where each die of the plurality of dies is associated with a corresponding one of the plurality of devices for testing. The method includes storing a sequence of bits indicative of results of the CP test for the plurality of dies. An initial bit of the sequence of bits is indicative of an overall result and one or more subsequent bits of the sequence of bits are indicative of which die, of the plurality of dies, is associated with failure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming, over a plurality of dies, a plurality of devices for testing,
wherein each of the plurality of dies is associated with at least a corresponding device of the plurality of devices;
forming a plurality of connectors over the plurality of dies, wherein each die, of the plurality of dies, is under at least one of the plurality of connectors;
forming a redistribution layer (RDL) over the plurality of connectors,
wherein the RDL and the plurality of connectors electrically connect the plurality of devices in series for testing;
performing a semiconductor device test on the plurality of dies using the plurality of devices; and
removing the RDL and the plurality of connectors after the semiconductor device test is performed.

2. The method of claim 1, wherein the plurality of dies is associated with a substrate that includes:
a first portion associated with a first die of the plurality of dies,
a second portion associated with a second die of the plurality of dies, and
an additional portion that is separate from the plurality of dies.

3. The method of claim 1, further comprising:
forming an initial testing module connected to the plurality of devices.

4. The method of claim 3, wherein the RDL and the plurality of connectors connect the plurality of devices in a closed loop with the initial testing module.

5. The method of claim 1, wherein removing the plurality of connectors comprises:

removing the plurality of connectors after removing the RDL.

6. The method of claim 1, further comprising:

forming a plurality of pads over the plurality of dies based on a result of the semiconductor device test.

7. The method of claim 1, further comprising:

removing connectors, of the plurality of connectors, associated with dies, of the plurality of dies, that fail the semiconductor device test.

8. A method, comprising:

forming, over a first portion of a substrate corresponding to a first die, a first device for testing;

forming, over a second portion of the substrate corresponding to a second die, a second device for testing;

forming a testing module over the substrate;

forming a redistribution layer (RDL) over the first device and the second device, wherein the RDL connects the first device and the second device in series with the testing module;

performing a test on the first die and the second die using the testing module, the first device, and the second device; and forming one or more pads over the first die and the second die using a result of the test.

9. The method of claim 8, wherein the first die and the second die are insulated via an isolation structure.

10. The method of claim 8, further comprising:

removing one or more of the first device or the second device after the test is performed.

11. The method of claim 8, further comprising:

forming one or more first pads over the first die based on a result of the test and based on a quantity of signals associated with the first die; and forming one or more second pads over the second die based on the result of the test and based on a quantity of signals associated with the second die.

12. The method of claim 8, wherein forming the RDL comprises:

forming the RDL in a dielectric layer.

13. The method of claim 8, wherein the RDL connects to the first die via a first connector and the RDL connects to the second die via a second connector, and wherein the first connector and the second connector are formed in a dielectric layer.

14. A method, comprising:

forming, over a substrate of a plurality of dies, a plurality of devices for testing, wherein each of the plurality of dies is associated with a corresponding device of the plurality of devices;

forming a redistribution layer (RDL) over the substrate, wherein the RDL connects the plurality of devices in series for testing;

performing a test on the plurality of dies using the plurality of devices;

removing the RDL after performing the test; and forming one or more pads over the plurality of dies using a result of the test.

15. The method of claim 14, wherein the one or more pads are only formed over dies, of the plurality of dies, that pass the test.

16. The method of claim 14, wherein the one or more pads are formed over dies in at least a portion of recesses left by removing the RDL.

17. The method of claim 14, wherein the one or more pads are formed according to a different layout than the RDL.

18. The method of claim 14, further comprising:

removing a first dielectric layer associated with the RDL; and forming a second dielectric layer after removing the first dielectric layer, wherein the one or more pads are formed in the second dielectric layer.

19. The method of claim 14, wherein the one or more pads are connected to one or more corresponding dies, of the plurality of dies, via one or more connectors.

*    *    *    *    *